United States Patent
Wakairo et al.

(10) Patent No.: US 7,294,852 B2
(45) Date of Patent: Nov. 13, 2007

(54) TRANSPARENT CONDUCTIVE FILMS AND PROCESSES FOR FORMING THEM

(75) Inventors: Masakatsu Wakairo, Kanuma (JP); Kiyoshi Ishii, Utsunomiya (JP)

(73) Assignee: Sony Chemical & Information Device Corporation, Tokyo (JP)

( * ) Notice: Subject to any disclaimer, the term of this patent is extended or adjusted under 35 U.S.C. 154(b) by 0 days.

(21) Appl. No.: 11/154,638

(22) Filed: Jun. 17, 2005

(65) Prior Publication Data

US 2005/0287724 A1    Dec. 29, 2005

Related U.S. Application Data

(63) Continuation of application No. PCT/JP03/16217, filed on Dec. 18, 2003.

(30) Foreign Application Priority Data

Dec. 18, 2002  (JP) .............................. 2002-366448

(51) Int. Cl.
  *H01L 21/00* (2006.01)
(52) U.S. Cl. ....................................................... 257/43
(58) Field of Classification Search ................... 257/43
  See application file for complete search history.

(56) References Cited

FOREIGN PATENT DOCUMENTS

| | | |
|---|---|---|
| EP | 1 081 718 A1 | 3/2001 |
| JP | 07-0211162 | 8/1995 |
| JP | 09-282945 | 10/1997 |
| JP | 10-330916 | 12/1998 |
| JP | 2000-265259 | 9/2000 |

OTHER PUBLICATIONS

Kiyoshi Ishii, Katsuyuki Kikkawa and Masakatsu Wakairo, Marked Effects of Bias-Sputtering on the Resistivity of ITO Films Prepared by Gas Flow Sputtering, Jun. 30, 2003, pp. 1141-1144.

*Primary Examiner*—Long Pham
(74) *Attorney, Agent, or Firm*—Oliff & Berridge, PLC

(57) ABSTRACT

A target containing an indium oxide and a tin oxide is used and sputtered particles from the target are transported by a forced gas flow of a sputter gas onto an organic substrate and deposited on the organic substrate while applying a DC bias voltage or an RF bias voltage to the organic substrate. The organic substrate is close to the target so that it is positively acted on by plasma. Thus, an ITO transparent conductive film having a resistivity of $10^{-3}$ ohm.cm or less is formed on the organic substrate. The formed ITO transparent conductive film has a ratio of 1:1 or more and 4:1 or less between the peak intensity the (222) plane and the peak intensity of the (400) plane of the indium tin oxide in X-ray diffraction.

2 Claims, 12 Drawing Sheets

TRANSPARENT CONDUCTIVE FILMS AND PROCESSES FOR FORMING THEM

This is a Continuation of International Application No. PCT/JP03/016217, filed Dec. 18, 2003. The entire disclosure of the prior application is hereby incorporated by reference herein in its entirety.

BACKGROUND

Aspects of the invention relates to transparent conductive films consisting of an oxide of indium and tin (ITO) and processes for forming them, particularly to transparent conductive films with very low resistivity formed on organic substrates without heating the substrates and processes for forming them.

Indium tin oxide (ITO) is widely used for transparent electrodes in various display devices such as liquid crystal displays and organic EL displays as well as transparent electrodes in touch panels.

ITO transparent conductive films are usually formed on glass substrates and provided with low resistivity by heating the substrates. For example, an ITO transparent conductive film with high crystallinity and low resistivity can be prepared by forming an ITO film by reactive DC magnetron sputtering using a sintered ITO as a target while heating the substrate to a temperature of 300° C. or more. Alternatively, an ITO transparent conductive film with low resistivity can be prepared by using an In—Sn alloy as a target and depositing a suboxide of In, InO and Sn on a substrate by reactive DC magnetron sputtering followed by a heat treatment at 170-180° C. in the atmosphere.

Thus, ITO must be crystallized and the substrate must be heated to at least 160° C. or more in order to obtain a transparent conductive film having a resistivity of $10^{-3}$ ohm.cm or less, e.g. on the order of $10^{-4}$ ohm.cm. If an ITO film is deposited without heating the substrate, the film shows a mixed amorphous/microcrystalline phase with a high resistivity on the order of $10^{-3}$ ohm.cm.

In the field of liquid crystal displays and organic EL displays, it has been proposed to replace glass substrates by organic substrates such as plastic substrates or plastic films, taking into account weight, thickness reduction and ability to be handled. Transparent electrodes for touch panels must also be formed on plastic films. However, it is difficult to heat these organic substrates such as plastic substrates and plastic films because they are vulnerable to heat. Thus, a major issue is to find a method for forming an ITO film with low resistivity on a heat-vulnerable organic substrate.

A method for forming an ITO transparent conductive film on a plastic film by reactive sputtering applying a bias voltage has been proposed (see e.g. JPA SHO 62-222518). According to this method described in publication document 1, an ITO transparent conductive film is formed on a transparent plastic film substrate by reactive sputtering while applying a bias voltage between the transparent conductive film and the ground for accelerating ions in the direction of the substrate, whereby a transparent conductive film with high transparency and adhesion and improved wear resistance can be stably prepared.

The so-called gas flow sputtering has been proposed as a method for forming various films without damaging substrates (see e.g. JPB HEI 2-14427 and JPA 2001-140066). The gas flow sputtering method is a transport sputtering method wherein sputtered particles generated in the anode are transported by an atmospheric gas flow toward the substrate, and JPA 2001-140066 discloses a method for forming a thin film by providing a exhaust port for discharging a sputtering gas in the direction perpendicular to the center axis of the target and placing a substrate on the side of the exhaust port in order to protect the substrate against the influence of plasma and high-energy particles.

However, the method of JPA SHO 62-222518 is essentially an extension of the prior art described above, and the resulting transparent conductive film does not have a low enough resistivity because the substrate is not heated, and therefore, it is difficult to achieve a transparent conductive film having a resistivity of, e.g., $10^{-3}$ ohm.cm or less.

In the gas flow sputtering method disclosed in patent JPB HEI 2-14427 or in JPA 2001-140066, the protection of the substrate against damages is stressed, but the characteristics of the deposited films are not always sufficiently considered. Especially, there is no report about the application of gas flow sputtering for forming an ITO transparent conductive film, or about the film characteristics of the deposited ITO transparent conductive films. In fact, the inventors tried to form an ITO transparent conductive film by the method described in patent JPA SHO 62-222518 or in JPB HEI 2-14427, but failed to deposit an ITO transparent conductive film on the order of $10^{-4}$ ohm.cm.

The present invention was proposed in view of the actual situation of the art for the purpose of providing a transparent conductive film having an unprecedented low resistivity formed on an organic substrate without heating the substrate as well as a process for forming it.

SUMMARY

An ITO conductive film with low resistivity can be formed by applying a bias voltage to the substrate in the gas flow sputtering method without damaging the substrate.

Exemplary embodiments of the present invention provides a transparent conductive film comprising mainly an oxide containing indium and tin formed on an organic substrate by sputtering that has a resistivity of $10^{-3}$ ohm.cm or less.

Exemplary embodiments of the present invention provide a transparent conductive film that has a ratio of 1:1 or more and 4:1 or less between the peak intensity of the (222) plane and the peak intensity of the (400) plane of the indium tin oxide in X-ray diffraction.

Exemplary embodiments of the present invention provide a transparent conductive film characterized in that the organic substrate is a plastic film.

Exemplary embodiments of the present invention also provide a process for forming a transparent conductive film, comprising using a target containing indium and tin and transporting sputtered particles from the target onto an organic substrate by a sputter gas flow to deposit them on the organic substrate while applying a bias voltage to the organic substrate.

Exemplary embodiments of the present invention provide the process for forming a transparent conductive film characterized in that the target is a hollow target and the sputter gas is flown along the center axis of the target while the organic substrate is placed at right angles to the center axis to oppose the flow of the sputter gas.

Exemplary embodiments of the present invention provide the process for forming a transparent conductive film characterized in that a voltage is applied to the target to generate a plasma to allow the plasma to produce sputtered particles.

Exemplary embodiments of the present invention provide the process for forming a transparent conductive film characterized in that the organic substrate is close to the target so that it is acted on by the plasma.

Exemplary embodiments of the present invention provide the process for forming a transparent conductive film characterized in that the distance between the organic substrate and the target is 2 cm or more and 10 cm or less.

Exemplary embodiments of the present invention provide the process for forming a transparent conductive film characterized in that the organic substrate is cooled from behind as needed.

Exemplary embodiments of the present invention can provide the process for forming a transparent conductive film characterized in that the transparent conductive film is continuously formed on a running plastic film used as the organic substance.

Exemplary embodiments of the present invention can provide the process for forming a transparent conductive film characterized in that a DC bias voltage is applied to the organic substrate as the bias voltage.

Exemplary embodiments of the present invention can provide the process for forming a transparent conductive film characterized in that the DC bias voltage is −80 V or more and −10 V or less with respect to the discharge plasma potential.

Exemplary embodiments of the present invention can provide the process for forming a transparent conductive film characterized in that a radio frequency bias voltage is applied to the organic substrate as the bias voltage.

Exemplary embodiments of the present invention can provide the process for forming a transparent conductive film characterized in that the radio frequency bias voltage is applied from a radio frequency electrode behind the organic substrate and the average (DC components) of the radio frequency voltage on the front surface of the organic substrate on which the transparent conductive film is to be deposited is −80 V or more and −10 V or less with respect to the discharge plasma potential.

The exemplary transparent conductive film of the present invention can include mainly an oxide containing indium and tin formed on an organic substrate by sputtering, characterized in that it has a resistivity of $10^{-3}$ ohm.cm or less.

Any transparent conductive film having a resistivity of $10^{-3}$ ohm.cm or less formed on an organic substrate has not been reported yet and a transparent conductive film with such low resistivity is first achieved by the present invention.

The low resistivity of the transparent conductive film of the present invention is thought to be related to the film-forming process, but the detailed mechanism and reason are yet unknown. However, X-ray diffraction analyses showed a great difference in film structure from films formed by conventional sputtering, for example. ITO transparent conductive films formed by conventional sputtering are (100) oriented films in which the peak from the (400) plane of indium tin oxide is dominant. Transparent conductive films having such a crystalline orientation will not show low resistivity unless they have high crystallinity. In transparent conductive films of the present invention, however, the peak from the (222) plane of indium tin oxide is observed and the orientation shifts to (111), which clearly shows a film structure wholly different from those of the films formed by conventional sputtering. The ratio between the peak intensity from the (222) plane and the peak intensity from the (400) plane depends on sputtering conditions or other factors, and our analyses showed that low resistivities are achieved when the ratio between the peak intensity of the (222) plane and the peak intensity of the (400) plane of indium tin oxide is 1:1 or more and 4:1 or less.

On the other hand, the process for forming a transparent conductive film according to the present invention comprises using a target containing an indium oxide and a tin oxide and transporting sputtered particles from the target onto an organic substrate by a sputter gas flow to deposit them on the organic substrate while applying a bias voltage to the organic substrate.

The film-forming process of the present invention is based on the so-called gas flow sputtering, and is mainly characterized by applying a bias voltage such as a DC bias voltage or radio frequency (RF) bias voltage. ITO transparent conductive films formed by conventional gas flow sputtering are porous, but they become compact by applying a bias voltage, i.e. ion bombardment. When a bias voltage is applied, the carrier density increases and the Hall mobility increases tenfold or more as compared with unbiased samples. This may explain the low resistivity.

The film-forming process of the present invention is further characterized in that the organic substrate is close to the target so that it is positively acted on by plasma to obtain an ITO transparent conductive film with good performance, and such a concept is also different from prior techniques in which thin films are formed on substrates protected against the influence of plasma and high-energy particles.

BRIEF DESCRIPTION OF THE DRAWINGS

Various exemplary embodiments of the systems and methods will be described in detail, with reference to the following figures, wherein.

DETAILED DESCRIPTION OF EMBODIMENTS

Figure 1:
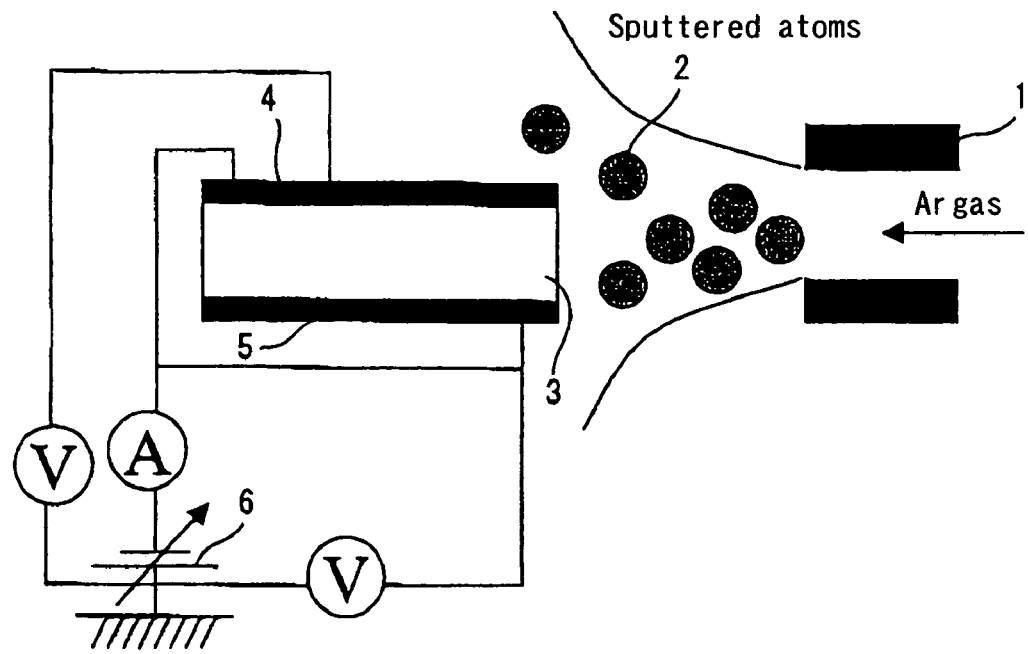
FIG. 1 is a schematic diagram of DC bias sputtering.

In the drawings, reference 1 represents a target, reference 2 represents sputtered particles, reference 3 represents a substrate, references 4, 5 represent Al electrodes (DC bias electrodes), and reference 8 represents an RF electrode.

Transparent conductive films and processes for forming them according to the present invention are explained below.

A basic concept of the present invention lies in forming an ITO transparent conductive film on an organic substrate by gas flow sputtering while applying a bias voltage, and processes for forming a transparent conductive film according to the present invention are explained first.

The exemplary method used to form an ITO transparent conductive film in the present invention is gas flow sputtering under higher operating pressures than used in conventional sputtering. In the case of gas flow sputtering, the atoms sputtered from the target are transported by a forced flow of a sputter gas (Ar gas) from behind the target to the substrate. During this atom transporting step, sputtered particles are heated by repeated collision and dispersion to release energy because pressure is higher than in conventional sputtering. Thus, low-energy particles are deposited on the substrate without damaging the substrate.

The substrate on which a film is to be formed here can be an organic substrate such as a plastic substrate or a plastic film because it is not damaged. Target materials for the target can be materials for ITO transparent conductive films such as oxides, metals, alloys and the like, specifically a mixture of indium oxide $In_2O_3$ and tin oxide $SnO_2$. Alternatively, an indium/tin alloy target can also be used.

The target may be cylindrical or flat, but not limited to any specific shape as long as a forced gas flow can be supplied along the target surface from one end. During sputtering, a voltage is applied to the target to generate a plasma to allow the plasma to produce sputtered particles. With this target, a large sputtering current can be obtained by using a hollow cathode discharge.

When the target is a hollow target and a sputter gas is flown along the center axis thereof as a forced gas flow, for example, the substrate is placed at a right angle to the center axis to oppose the forced gas flow. Thus, the forced gas flow is directly blown on the surface of the substrate, whereby the sputtered particles carried by the forced gas flow are efficiently deposited on the surface of the substrate.

The distance between the substrate and the target here is preferably as small as possible and the substrate is close to the target so that it is affected by the plasma. The optimal distance between the substrate and the target is preferably 2 cm or more to 10 cm or less, for example, depending on the design of the equipment, the magnitude of the bias voltage described below, plasma conditions, and the like. If the distance between the substrate and the target is too large, it becomes difficult to obtain a low-resistivity film because the substrate is not sufficiently subjected to the bias voltage. However, if the distance is too small, the substrate may be damaged when it is a plastic film or the like. A cooling mechanism such as cooling water circulating in the substrate holder is effective to avoid such damages to the substrate. Even when the substrate is exposed to the influence of plasma, the substrate will not be damaged by including a cooling mechanism in the substrate holder placed behind the substrate to cool the substrate.

In the process for forming an ITO transparent conductive film on an organic substrate by gas flow sputtering as described above, a bias voltage may be applied to the organic substrate. The crystallinity can be improved to give an ITO transparent conductive film with low resistivity by bias sputtering, i.e. applying a DC bias voltage or an AC (radio frequency: RF) bias voltage to drive off impurities (nitrogen or the like) in the deposited ITO transparent conductive film. Moreover, the resulting ITO transparent conductive film is harder and more compact than a film obtained by conventional gas flow sputtering, and the adhesion to the organic substrate is also improved.

FIG. 1 is a schematic diagram showing the principle of DC bias sputtering in gas flow sputtering, in which electrodes 4, 5 are placed at least partially on the surface of a substrate 3 that is insulative at least on the surface.

The electrodes 4, 5 are formed by patterning a metal thin film (a thin film of a metal such as, for example, aluminum) formed by vapor deposition or sputtering, and close contact with the surface of the substrate 3.

The substrate 3 may be rectangular as shown in FIG. 1, and the electrodes 4, 5 are placed on the two longitudinal sides of the substrate 3. The surface of the substrate 3 is exposed between the electrodes 4, 5.

These electrodes 4, 5 are connected to a DC source 6 so that the same magnitude of voltage is applied to the two electrodes 4, 5.

The target 1 has a hollow, e.g. cylindrical shape with one end facing the surface of the substrate 3 on which the electrodes 4, 5 are formed, and a sputtering gas (e.g. Ar gas) is introduced into the inner space of the cylinder from the other end of the target 1 while applying a negative voltage to the electrodes 4, 5 from the DC source 6. The inner surface of the target 1 exposed in the inner space of the cylinder is sputtered by applying a voltage to the target 1, so that sputtered particles 2 generated from the target 1 are carried by the sputtering gas flowing in the inner space of the cylinder to reach the surface of the substrate 3 and the surfaces of the electrodes 4, 5 and adhere to them, whereby an ITO transparent conductive film grows.

The growing ITO transparent conductive film is in contact with the electrodes 4, 5 and the part thereof on the surface of the substrate 3 is also electrically connected to the electrodes 4, 5.

Thus, the ITO transparent conductive film grows under the negative voltage applied from the DC source 6, and therefore, positive ions of the sputtering gas in the plasma impinge on the surface of the growing ITO transparent conductive film, thereby improving the crystallinity.

Figure 2:
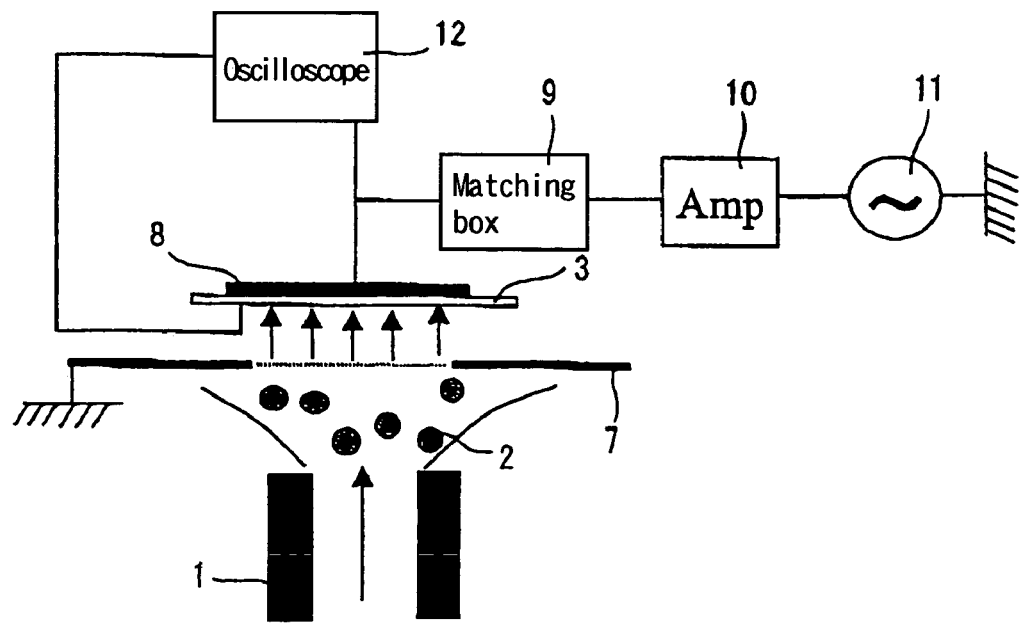
FIG. 2 is a schematic diagram of RF bias sputtering.

FIG. 2 is a schematic diagram showing the principle of RF bias sputtering in gas flow sputtering. In the case of RF bias sputtering, a ground plate 7 is placed in front of a substrate 3 and an RF electrode 8 is placed behind the substrate 3 and connected to an RF source 11 via a matching box 9 and an amplifier 10. The RF bias voltage applied is monitored by an oscilloscope 12. In the case of RF bias sputtering, a bias voltage can be applied to insulative substrates.

The bias voltage is preferably −80 V or more to −10 V or less with respect to the discharge plasma potential in the case of DC biasing as shown in FIG. 1, for example. If the DC bias voltage is less than −10 V with respect to the discharge plasma potential, the resistivity of the resulting ITO transparent conductive film may not be sufficiently low and it becomes difficult to achieve a resistivity of $10^{-3}$ ohm.cm or less. If the DC bias voltage exceeds −80 V with respect to the discharge plasma potential, however, the film may be damaged by a discharge on the film surface during deposition.

In the case of RF biasing as shown in FIG. 2, the RF bias voltage self-biased to the surface of the organic substrate is preferably −100 V or less (DC components) and the electrode voltage of the bias electrode behind the substrate must be controlled. Particularly, it is preferably controlled by applying a radio frequency voltage from a radio frequency electrode behind the organic substrate so that the average (DC components) of the radio frequency voltage on the front surface of the organic substrate on which a transparent conductive film is to be deposited is −80 V or more and −10 V or less with respect to the discharge plasma potential. This results in a resistivity on the order of $10^{-4}$ ohm.cm. The frequency of the RF bias voltage is preferably 300 kHz or more.

Other sputtering conditions in gas flow sputtering are as follows. For example, the sputtering pressure is preferably 13 Pa or more to 133 Pa or less. The sputtering power is preferably 1.6 W/cm$^2$ or more to 11 W/cm$^2$ or less. The Ar gas flow rate depends on the size of the target, but it is preferably 1000 sccm or more (+1000 sccm) when the open area is 80 cm$^2$, for example. In this case, the O$_2$ gas flow rate is preferably 10 sccm or less.

As described above about the outline of gas flow sputtering according to the present invention, an ITO transparent conductive film having an unprecedented low resistivity can be formed on an organic substrate such as a plastic substrate by combining gas flow sputtering and bias sputtering.

Gas flow sputtering is advantageous for forming a film on an organic substrate such as a plastic film because the substrate is not damaged, but low resistivity cannot be achieved when it is applied to form, for example, an ITO transparent conductive film. Analyses of electric characteristics of ITO transparent conductive films formed by gas flow sputtering show a specific resistance as high as $1 \times 10^{-2}$ ohm.cm. This is attributed to the low carrier density and very low Hall mobility. ITO transparent conductive films formed by gas flow sputtering show a low carrier density because of poor substitution of Sn and In. Elementary analyses showed that the films contain nitrogen, which seems to form neutral scattering centers to decrease the mobility.

When a bias voltage is applied, the mobility becomes tenfold or more as compared with unbiased samples, which may lead to low resistivity. Especially when the substrate is close to the target so that it is affected by the plasma, relatively high-energy sputtered particles are deposited on the substrate and therefore, an ITO transparent conductive film with very low resistivity can be formed by synergy with the biasing effect described above.

The transparent conductive film of the present invention formed by the process described above is an ITO transparent conductive film based on an oxide containing indium and tin formed on an organic substrate and having a very low resistivity of about $10^{-3}$ ohm.cm or less. Specifically, a film having a low resistivity of $2.5 \times 10^{-4}$ ohm.cm could be prepared at a DC bias voltage of −50 V, and a low resistivity of $3.3 \times 10^{-4}$ ohm.cm could be prepared at a RF electrode voltage of 160 V.

ITO transparent conductive films of the present invention have an amorphous-like microcrystalline structure and greatly differ in film structure from conventionally sputtered films having an obviously crystalline structure. This difference in crystalline structure is also evident from X-ray diffraction results, which show the peak of the (222) plane and (111)-oriented components in ITO transparent conductive films of the present invention. Conventionally, sputtered films are (100) oriented with the dominant peak of the (400) plane. Although the detailed mechanism of the relation of this difference in crystalline structure to the electric resistance is unknown, ITO transparent conductive films of the present invention were found to have a low resistivity when the ratio between the peak intensity of the (222) plane and the peak intensity of the (400) plane of indium tin oxide is 1:1 or more and 4:1 or less.

Specific examples of the present invention are explained below on the basis of experimental results.

Gas Flow Sputtering+DC Biasing

In the present experiment, DC bias voltages were applied to a substrate in gas flow sputtering to evaluate their effects.

Figure 3:
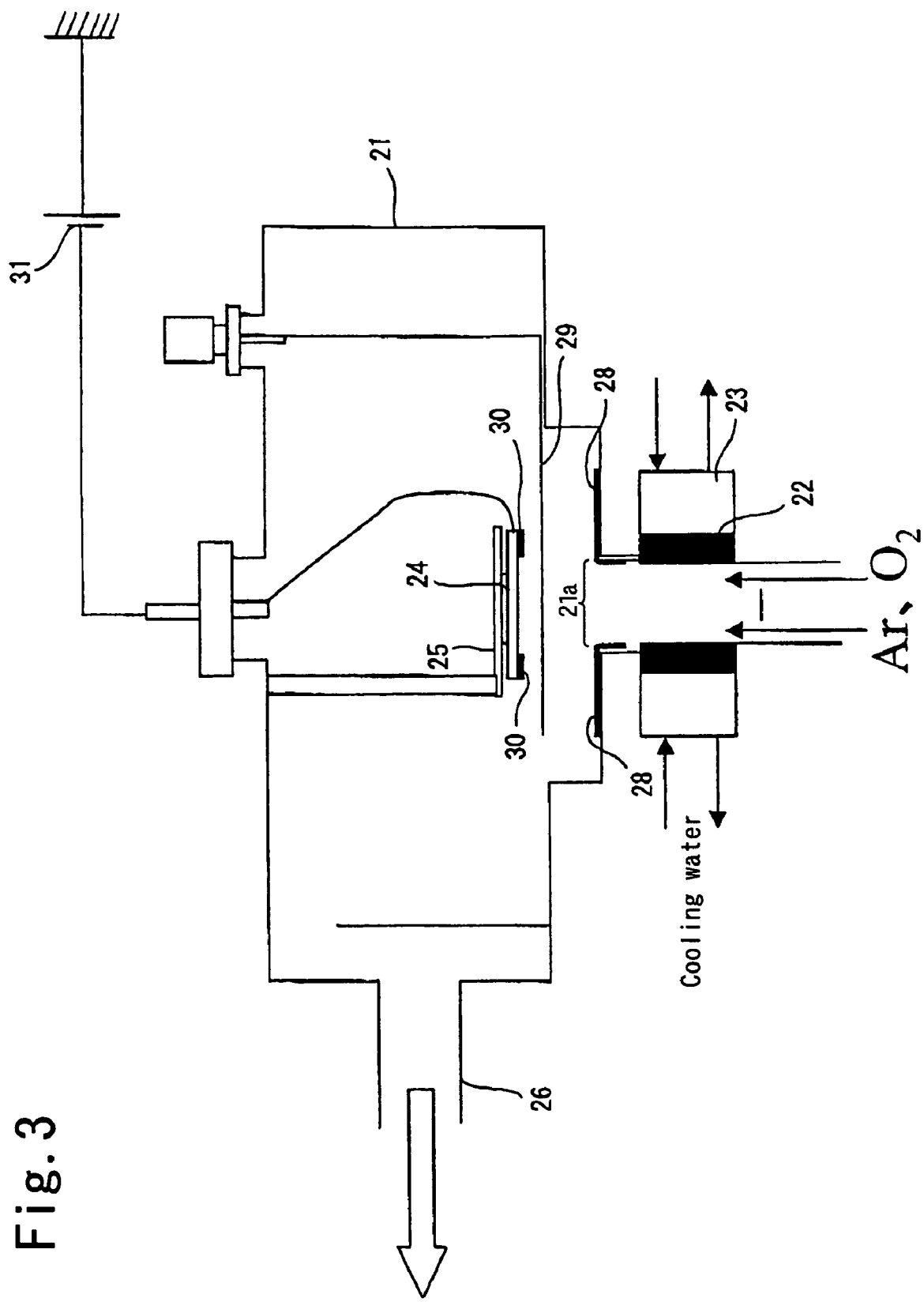
FIG. 3 shows the outline structure of the DC bias gas flow sputtering apparatus used in the experiment.

The structure of the sputtering apparatus used in the present experiment is shown in FIG. 3. This gas flow sputtering apparatus comprises a vacuum chamber 21, a target 22 having a cooling mechanism 23, and a substrate holder 25 supporting a substrate 24 on which an ITO transparent conductive film is to be formed, wherein the target 22 having the cooling mechanism 23 is placed below the vacuum chamber 21 and the substrate 24 is supported by the substrate holder 25 in the vacuum chamber 21. A forced gas flow of Ar gas and oxygen gas is supplied from behind the target 22, whereby sputtered particles generated from the target 22 are transported on this forced gas flow onto the substrate 24 and deposited on it. The vacuum chamber 21 is provided with an exhaust port 26 on a lateral side at right angles to the center axis of the target 22, and the Ar gas and oxygen gas supplied are rapidly evacuated via this exhaust port 26.

In the sputtering apparatus of the present example, an anti-discharge plate 28 made from a metal such as aluminum is placed at a forced gas flow inlet 21a of the vacuum chamber 21 to prevent unnecessary arc discharge from occurring at that part.

A shutter 29 for blocking off unnecessary sputtered particles and forced gas flow is placed near the substrate 24 on which an ITO transparent conductive film is to be formed, and the shutter 29 is opened as needed to form an ITO transparent conductive film on the substrate 24 by gas flow sputtering.

An electrode 30 is arranged on the surface of the substrate 24 along the periphery.

This electrode 30 is annular and planar. It is identical to the electrodes 4, 5 shown in FIG. 1 in the material and structure except for the planar shape, and it is designed in such a manner that when a DC bias voltage source is activated to apply a DC voltage to the electrode 30, the voltage is applied to the growing ITO transparent conductive film.

ITO transparent conductive films were formed by using the sputtering apparatus described above under DC bias sputtering conditions below.

DC Bias Sputtering Conditions:
  Sputtering pressure: 15 Pa
  Sputtering power: 500 W
  Ar gas flow rate: 1000 sccm (+1000 sccm)
  O$_2$ gas flow rate: 0 sccm or more and 5 sccm or less
  Pre-evacuation: $8 \times 10^{-3}$ Pa or less
  Substrate: Polyethylene terephthalate
  DC bias voltage (with respect to the discharge plasma potential): −80 or more and 0 V or less
  Target: In$_2$O$_3$: SnO$_2$=95:5 (% by weight)
  Substrate temperature: Room temperature (the substrate not heated).

Figure 4:
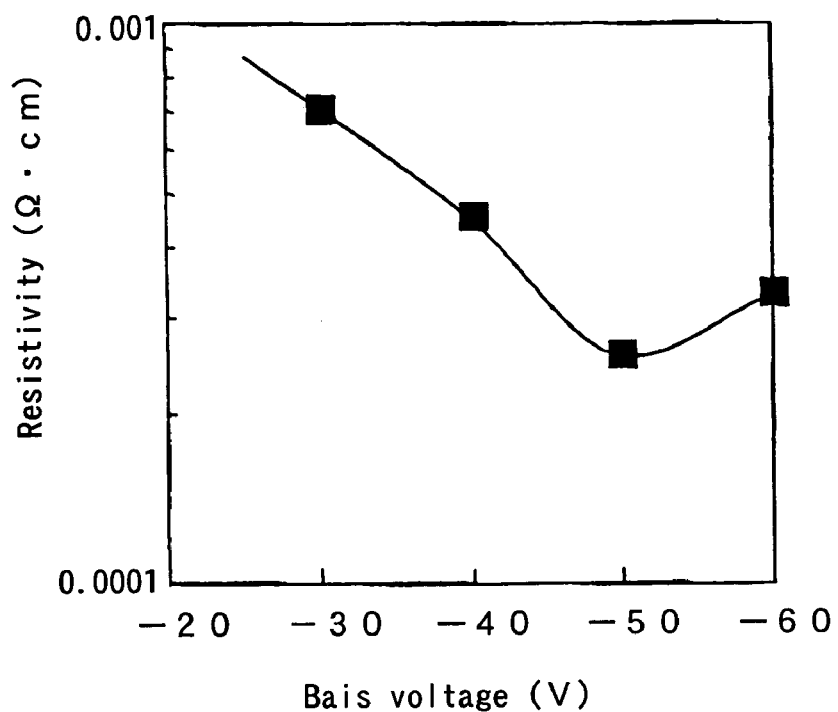
FIG. 4 is a characteristic diagram showing the relation between the DC bias voltage and the resistivity of the formed ITO transparent conductive film.

FIG. 4 shows the relation between the DC bias voltage and the resistivity of the formed ITO transparent conductive film at an oxygen flow rate of 1.2 sccm. As shown from the figure, the resistivity was the lowest when the DC bias voltage was −50 V. When the DC bias voltage was −80 V or less, a discharge was observed on the film surface during deposition.

Figure 5:
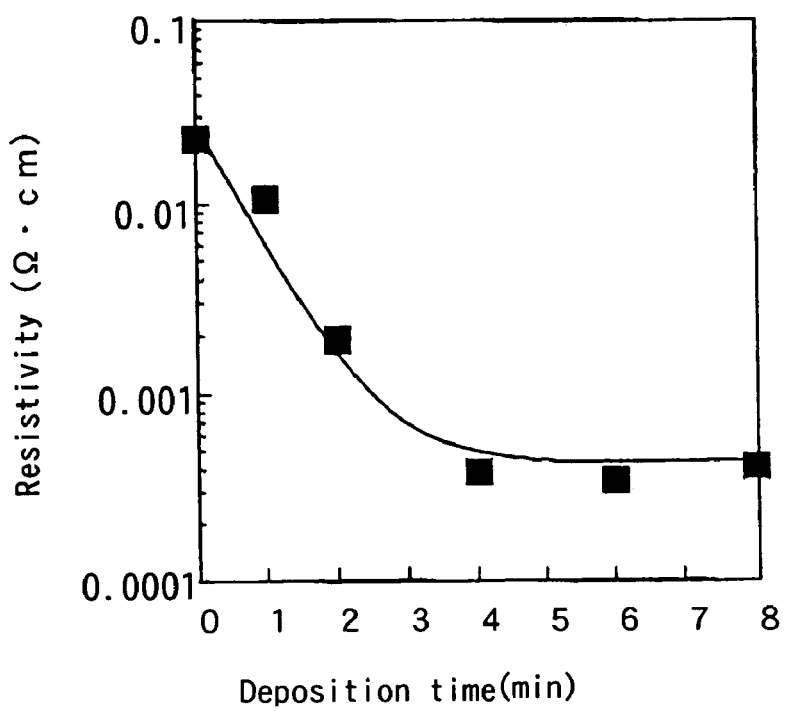
FIG. 5 is a characteristic diagram showing the relation between the deposition time and the resistivity at a DC bias voltage of −50 V.

FIG. 5 shows the relation between the deposition time and the resistivity at a DC bias voltage of −50 V. ITO transparent conductive films with low resistivity were obtained at a deposition time of 4 minutes or more. At a deposition time of less than 4 minutes, it seems that the resistivity is influenced by the initial layer to which the bias voltage has not been applied.

Figure 6:
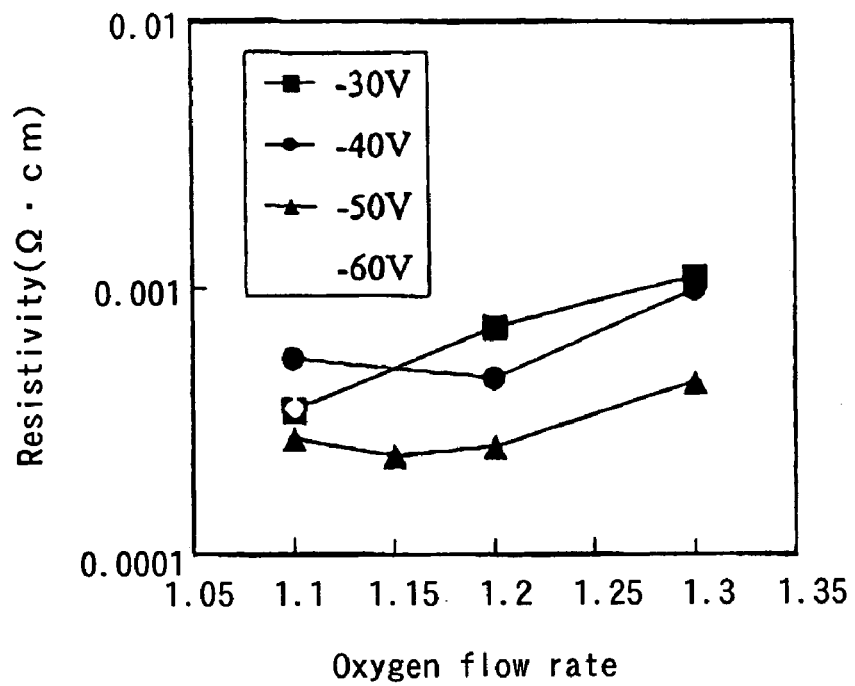
FIG. 6 is a characteristic diagram showing the relation between the oxygen flow rate and the resistivity at various DC bias voltages.
Figure 7:
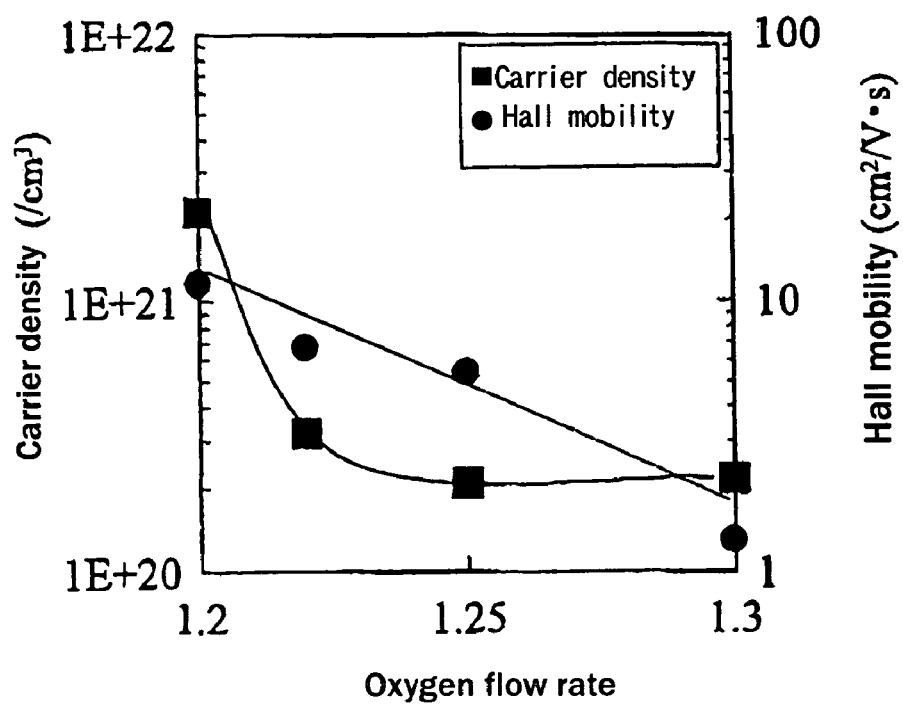
FIG. 7 is a characteristic diagram showing the dependence of the carrier density and Hall mobility on the oxygen flow rate at a DC bias voltage of −30 V.

FIG. 6 shows the relation between the oxygen flow rate and the resistivity at various DC bias voltages, and FIG. 7 shows the dependence of the carrier density and Hall mobility on the oxygen flow rate at a DC bias voltage of −30 V. In both cases, better results were obtained at lower oxygen flow rates.

Figure 8:
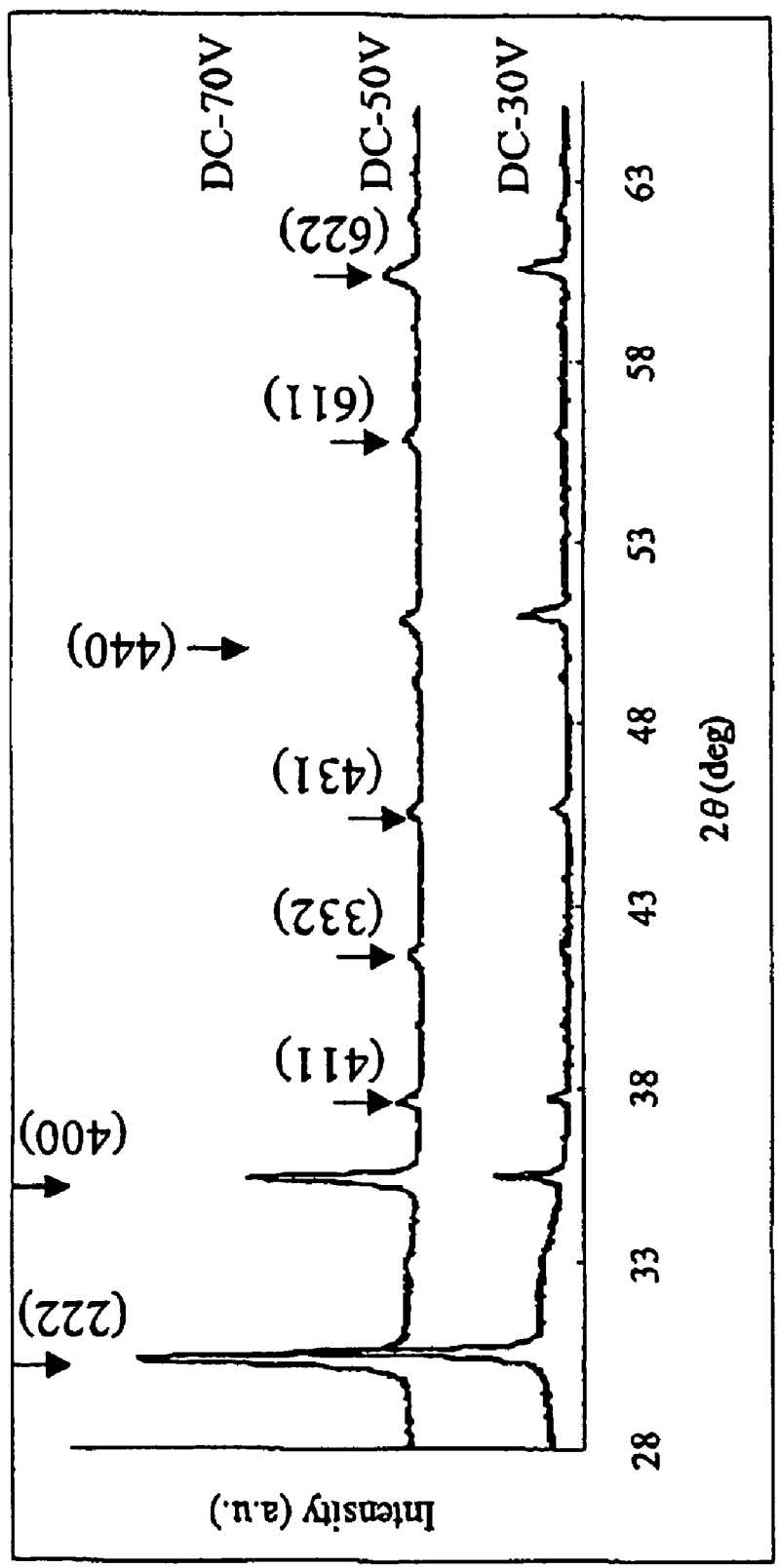
FIG. 8 is an X-ray diffraction chart showing the crystallinity at various DC bias voltages.

FIG. 8 is an X-ray diffraction chart showing the crystallinity at various DC bias voltages with an oxygen flow rate of 1.2 sccm. As the bias voltage become big, the orientation shifts from (111) to (100). At a DC bias voltage of −70 V, fewer diffraction peaks appear than at smaller voltages.

Figure 9A:
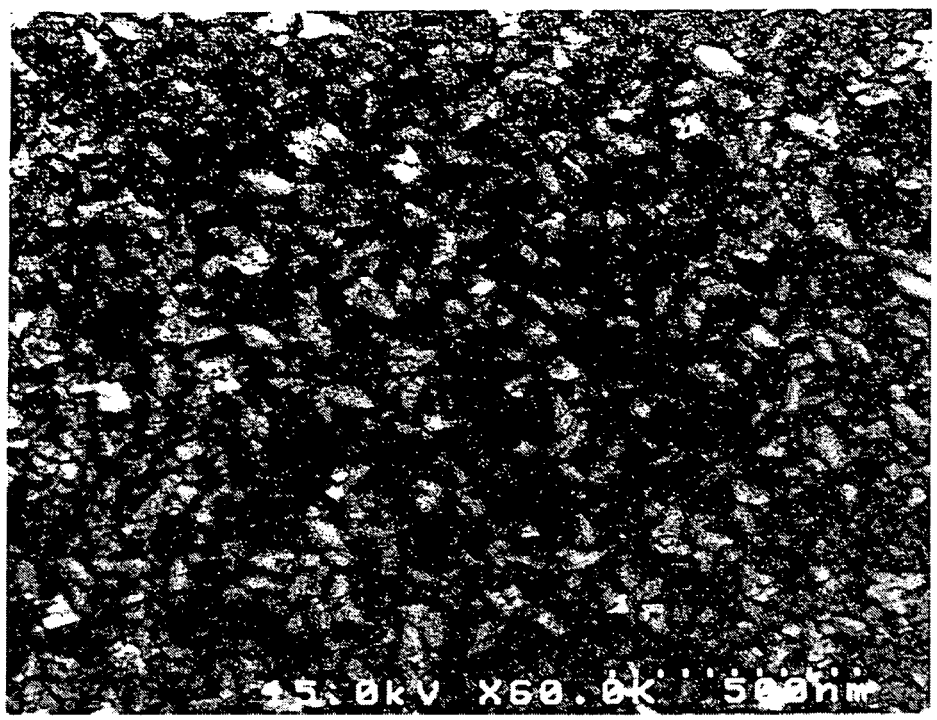
FIGS. 9A-9C represent scanning electron micrographs showing the surface morphologies of ITO transparent conductive films obtained by DC bias gas flow sputtering at DC bias voltages of −30 V (FIG. 9A), −50 V (FIG. 9B), and −70 V (FIG. 9C)
Figure 9B:
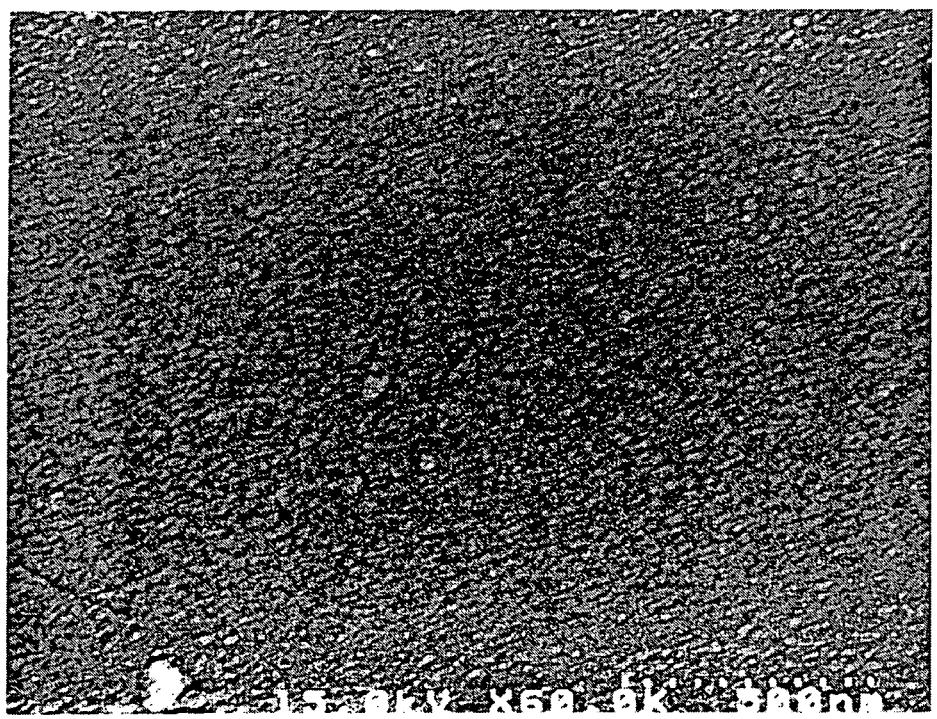
Figure 9C:
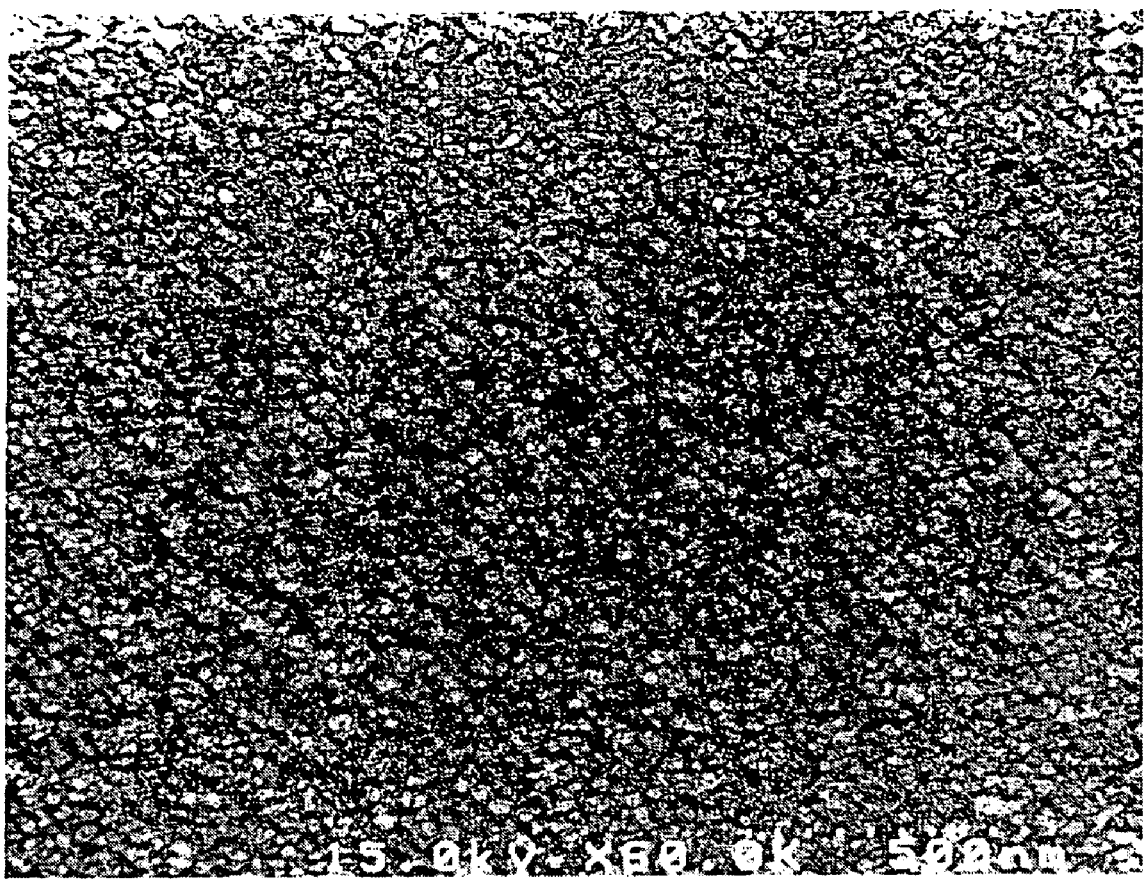

FIG. 9 represents scanning electron micrographs (SEM) showing the surface morphologies of the resulting ITO transparent conductive films (magnification ×60000). The surfaces of the ITO transparent conductive films are shown at DC bias voltages of −30 V (FIG. 9A), −50 V (FIG. 9B), and −70 V (FIG. 9C). As the DC bias voltage increases, the crystals become finer.

Gas Flow Sputtering+RF Biasing

In the present experiment, RF bias voltages were applied to a substrate in gas flow sputtering to evaluate their effects.

Figure 10:
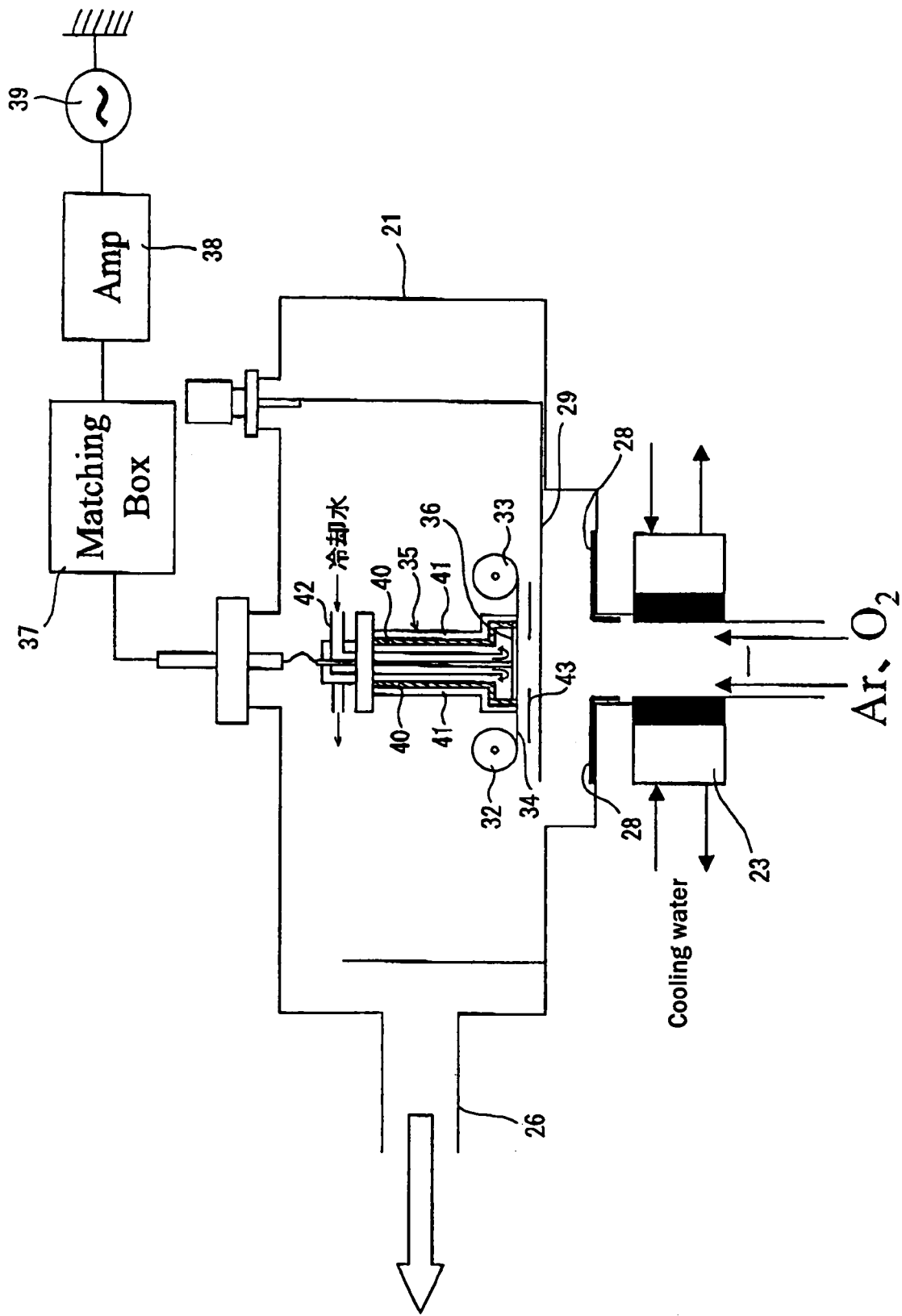
FIG. 10 shows the outline structure of the RF bias gas flow sputtering apparatus used in the experiment.

The structure of the sputtering apparatus used in the present experiment is shown in FIG. 10. This gas flow sputtering apparatus has the same basic structure as that of the sputtering apparatus shown in FIG. 3 except for some changes for applying an RF bias voltage. Specifically, a film is formed on a film-shaped organic substrate 34 running between a pair of rolls 32, 33 in this example. A bias applying unit 35 having an RF biasing electrode 36 is placed behind the running organic substrate 34, and the RF bias electrode 36 is connected to a radio frequency voltage source 39 via a matching box 37 and an amplifier 38. The bias applying unit 35 is provided with a ground shield 41 on the outer circumferential face via an insulator 40 and a cooling water circulating mechanism 42 for supplying cooling water to the inside. A ground shield 43 is also inserted between the organic substrate 34 and the shutter 29.

ITO transparent conductive films were formed by using the sputtering apparatus described above under RF bias sputtering conditions below.

RF Bias Sputtering Conditions:
  Sputtering pressure: 15 Pa
  Sputtering power: 500 W
  Ar gas flow rate: 1000 sccm (+1000 sccm)
  $O_2$ gas flow rate: 0 sccm or more and 5 sccm or less
  Pre-evacuation: $8 \times 10^{-3}$ Pa or less
  Substrate: Polyethylene terephthalate (thickness 125 μm)
  RF bias voltage: −75 or more and 0 V or less (DC components)
  RF electrode voltage: 0 $V_{P-P}$ or more and 200 $V_{P-P}$ or less
  Frequency: 10 MHz
  Target: $In_2O_3$: $SnO_2$=95:5 (% by weight)
  Substrate temperature: Room temperature (the substrate not heated).

In the conditions above, the RF bias voltage is equivalent to the peak voltage (peak to peak voltage) $V_{P-P}$ in an RF electrode voltage waveform. In the conditions above, the RF bias voltage (DC components) on the front surface of the substrate was about 0.28 times of the RF electrode voltage.

Figure 11:
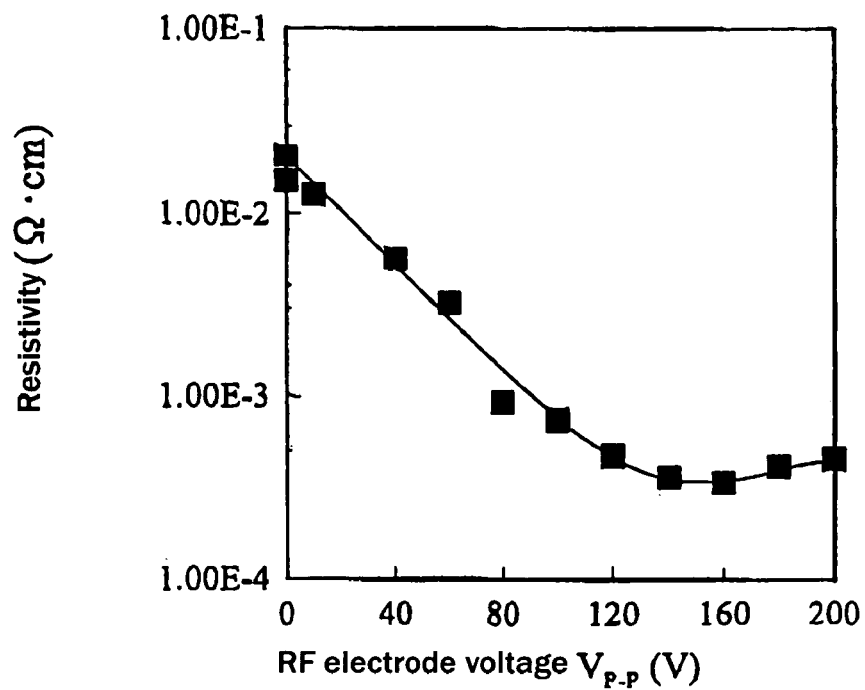
FIG. 11 is a characteristic diagram showing the relation between the RF electrode voltage and the resistivity of the formed ITO transparent conductive film.

FIG. 11 shows the relation between the RF electrode voltage and the resistivity of the formed ITO transparent conductive film at an oxygen flow rate of 1.2 sccm. When the RF electrode voltage is 100 $V_{P-P}$ or more, the resistivity was on the order of $10^{-4}$ ohm.cm. When the RF electrode voltage is 160 $V_{P-P}$, the lowest resistivity of $3.33 \times 10^{-4}$ ohm.cm was obtained.

Figure 12:
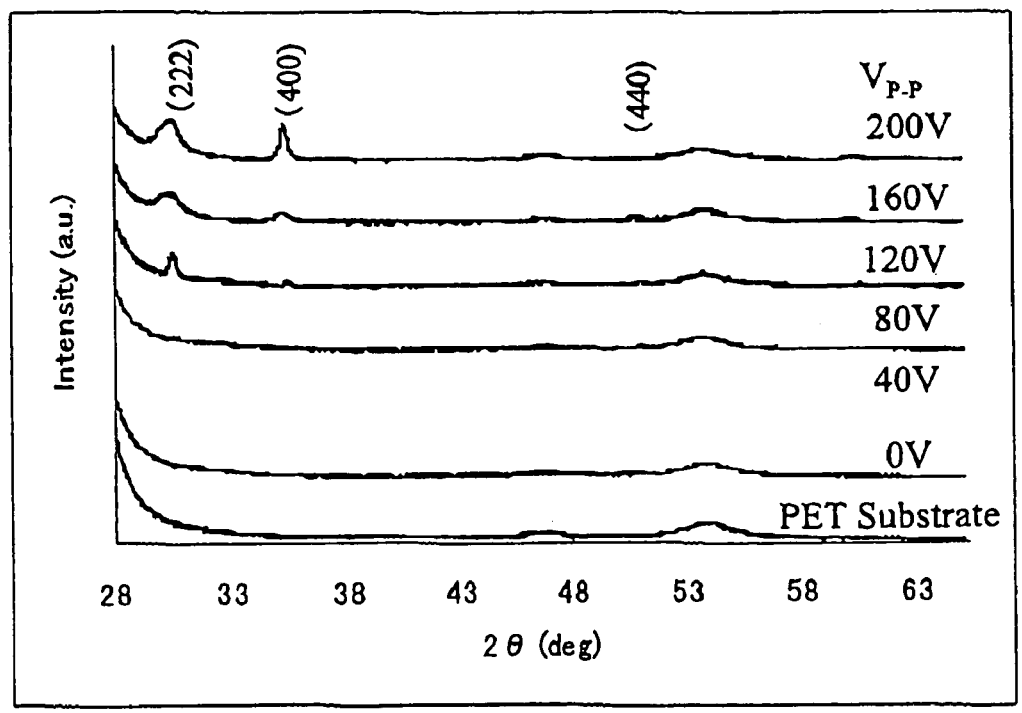
FIG. 12 is an X-ray diffraction chart showing the crystallinity at various RF electrode voltages.
Figure 13A:
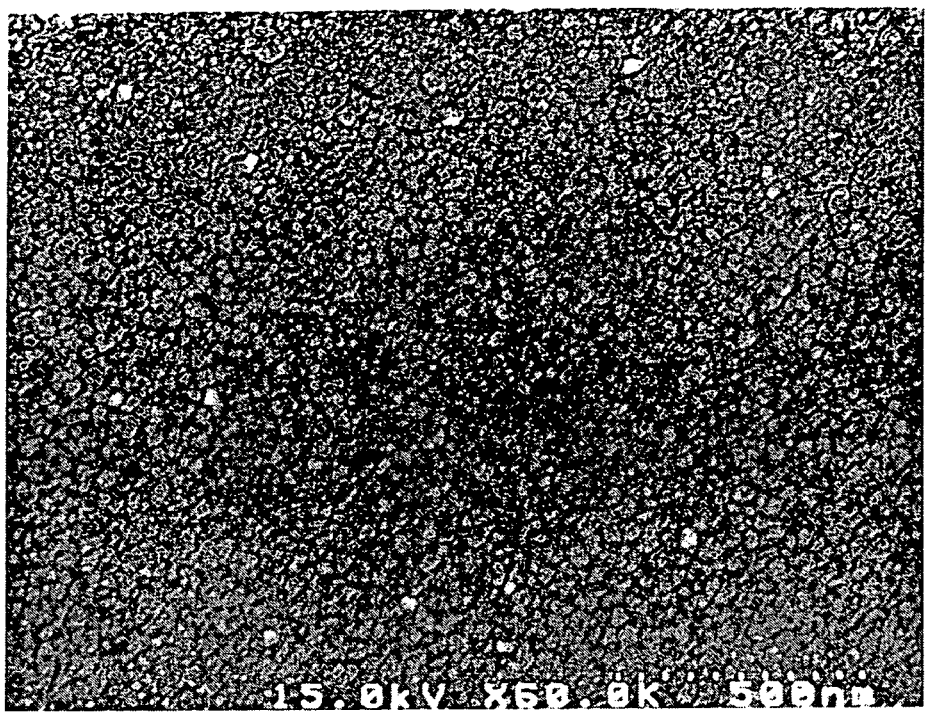
FIGS. 13A-13F represent scanning electron micrographs showing the surface morphologies of ITO transparent conductive films obtained by RF bias gas flow sputtering at RF electrode voltages of 0 $V_{P\text{-}P}$ (FIG. 13A), 40 $V_{P\text{-}P}$ (FIG. 13B), 80 $V_{P\text{-}P}$ (FIG. 13C), 120 $V_{P\text{-}P}$ (FIG. 13D), 160 $V_{P\text{-}P}$ (FIG. 13E), and 200 $V_{P\text{-}P}$ (FIG. 13F).
Figure 13B:
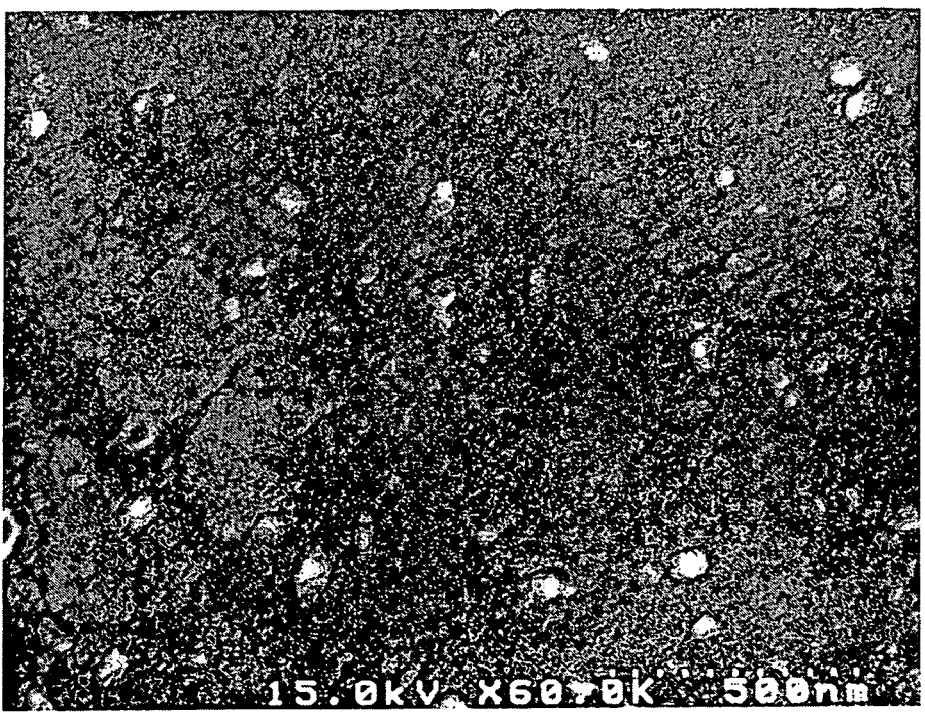
Figure 13C:
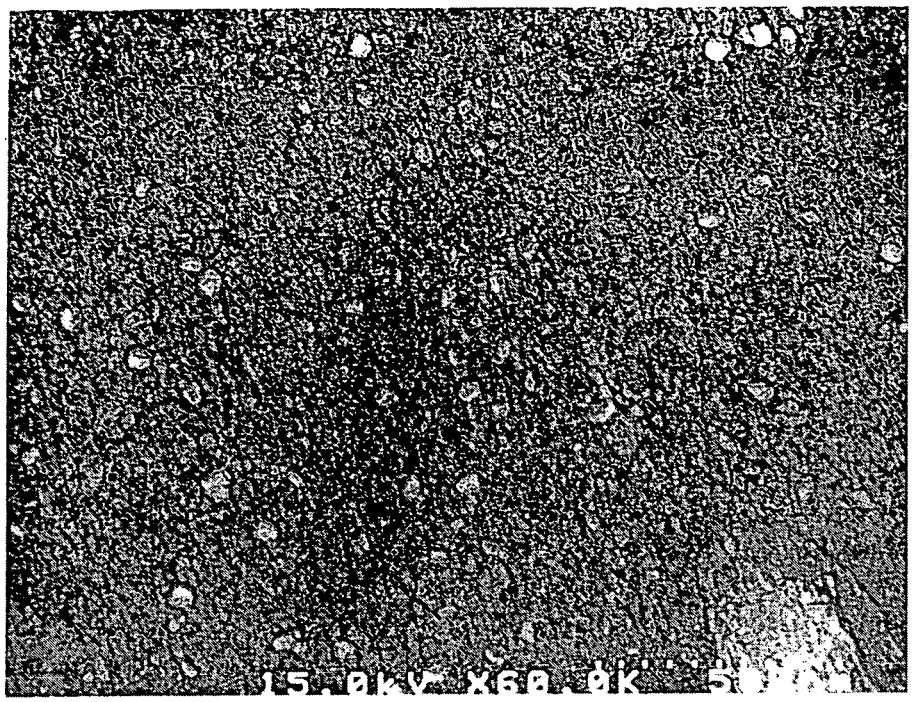
Figure 13D:
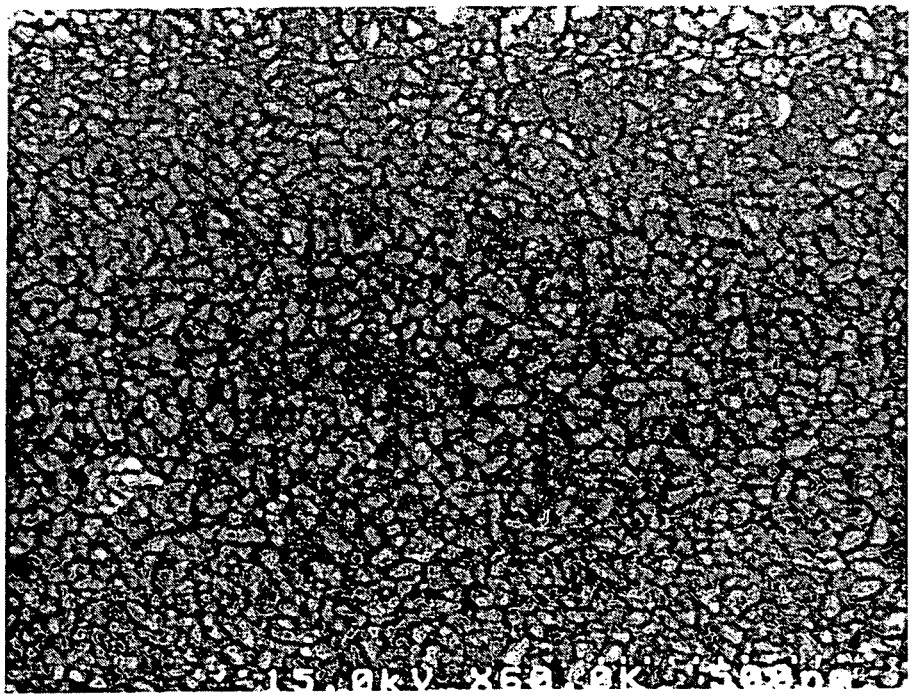
Figure 13E:
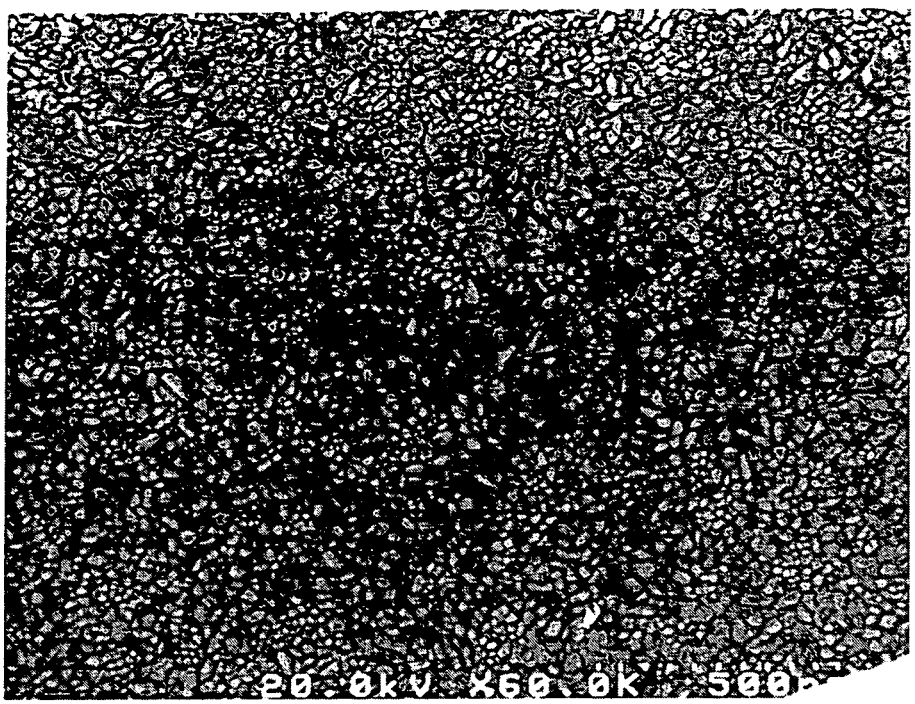
Figure 13F:
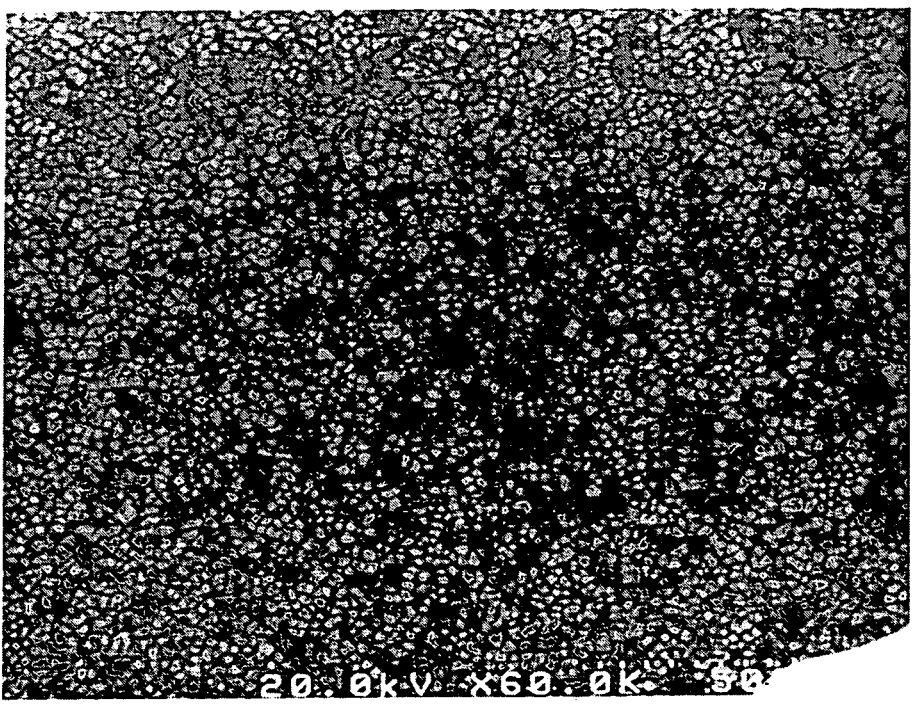

FIG. 12 is an X-ray diffraction chart showing the crystallinity at various RF electrode voltages at an oxygen flow rate of 1.2 sccm. When the RF electrode voltage is 80 $V_{P-P}$ or more, the crystallinity is found to be improved as the peaks of the (222) and (400) planes were observed. The peak of the (222) plane is broad at voltages of 160 $V_{P-P}$ or more, while the peak of the (400) plane is large at 200 $V_{P-P}$. Under these conditions, samples at an RF electrode voltage of 120 $V_{P-P}$ show the best results.

FIG. 13 represents scanning electron micrographs (SEM) showing the surface morphologies of the resulting ITO transparent conductive films (magnification ×60000). The surfaces of the ITO transparent conductive films are shown at RF electrode voltages of 0 $V_{P-P}$ (FIG. 13A), 40 $V_{P-P}$ (FIG. 13B), 80 $V_{P-P}$ (FIG. 13C), 120 $V_{P-P}$ (FIG. 13D), 160 $V_{P-P}$ (FIG. 13E), and 200 $V_{P-P}$ (FIG. 13F). The crystallinity is improved at RF electrode voltages of 120 $V_{P-P}$ or less, but the grain size decreases at higher voltages.

According to the exemplary embodiments of the invention, a DC voltage is applied to an electrode on the insulative surface of a substrate or an AC voltage is applied to an electrode behind the substrate, whereby the DC voltage or AC voltage is applied not only to the substrate but also to the growing transparent conductive film, as described above.

The foregoing description demonstrates that, according to the present invention, ITO transparent conductive films having a unprecedented low resistivity on the order of $10^{-4}$ ohm.cm can be formed on an organic substrate such as a plastic film without heating the substrate.

What is claimed is:

1. A transparent conductive film comprising an oxide containing indium and tin, the oxide being formed on an organic substrate by sputtering,
    wherein the transparent conductive film has a ratio of about 1:1 or more to about 4:1 or less between a peak intensity of a (222) plane and a peak intensity of a (400) plane of the indium tin oxide in X-ray diffraction, and the oxide has a resistivity of $10^{-3}$ ohm.cm or less.

2. The transparent conductive film according to claim 1, the organic substrate comprising a plastic film.

* * * * *